(12) United States Patent
Wang et al.

(10) Patent No.: US 12,009,313 B2
(45) Date of Patent: Jun. 11, 2024

(54) SEMICONDUCTOR PACKAGE SHIELDING STRUCTURE

(71) Applicant: Advanced Semiconductor Engineering, Inc., Kaohsiung (TW)

(72) Inventors: Meng-Jen Wang, Kaohsiung (TW); Chien-Yuan Tseng, Kaohsiung (TW); Hung Chen Kuo, Kaohsiung (TW); Ying-Hao Wei, Kaohsiung (TW); Chia-Feng Hsu, Kaohsiung (TW); Yuan-Long Chiao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 323 days.

(21) Appl. No.: 17/492,493

(22) Filed: Oct. 1, 2021

(65) Prior Publication Data

US 2023/0104397 A1 Apr. 6, 2023

(51) Int. Cl.
| | |
|---|---|
| *H01L 23/552* | (2006.01) |
| *H01L 21/56* | (2006.01) |
| *H01L 23/31* | (2006.01) |
| *H01L 23/538* | (2006.01) |

(52) U.S. Cl.
CPC .......... *H01L 23/552* (2013.01); *H01L 21/568* (2013.01); *H01L 23/3128* (2013.01); *H01L 23/5389* (2013.01)

(58) Field of Classification Search
None
See application file for complete search history.

(56) References Cited

U.S. PATENT DOCUMENTS

| | | | |
|---|---|---|---|
| 6,737,750 B1* | 5/2004 | Hoffman | H01L 25/0657 257/777 |
| 2015/0200180 A1* | 7/2015 | Fam | H01L 29/84 438/51 |
| 2017/0148744 A1* | 5/2017 | Carson | H01L 21/4853 |

* cited by examiner

*Primary Examiner* — Jay C Chang
(74) *Attorney, Agent, or Firm* — FOLEY & LARDNER LLP

(57) ABSTRACT

A selective EMI shielding structure for a semiconductor package and a method of fabrication thereof is disclosed. The semiconductor package, comprising: a substrate having a first face; at least one first electronic component mounted adjacent to a first region of the first face; a least one second electronic component mounted adjacent to a second region of the first face; and an encapsulant disposed over the first and the second electronic components, wherein the encapsulant covers directly over the first electronic component, and wherein the encapsulant covers the second electronic component through a layer of conductive material.

5 Claims, 10 Drawing Sheets

SEMICONDUCTOR PACKAGE SHIELDING STRUCTURE

BACKGROUND

1. Technical Field

The present disclosure generally relates to semiconductor device packages and manufacturing methods thereof, and pertains particularly to semiconductor package modules with selective electromagnetic interference (EMI) shielding.

2. Description of the Related Art

As the performance of microelectronics increases, the complexity and delicacy of the devices also increases. For one thing, the adverse effects from electromagnetic interference (EMI) become more pronounced.

A common way to reduce EMI is to provide shielding protection for a set of semiconductor devices within a device package. Shielding can be accomplished by providing an electrically conductive casing or housing that is electrically grounded and secured to an exterior of the package module. When electromagnetic emissions from an interior of the package strike an inner surface of the casing, at least a portion of these emissions can be electrically shorted, thereby reducing the level of emissions that can pass through the casing and affect the neighboring devices. Similarly, when electromagnetic emissions from a neighboring semiconductor device strike an outer surface of the casing, a similar electrical shorting can occur to reduce EMI of semiconductor devices within the package.

Selective EMI shielding schemes help to enable higher degrees of device integration over a mounting surface of a substrate. By way of example, signal transceiving devices and EMI sensitive components may thus be integrated on a same mounting surface without interfering one another. In some applications, existing wire bonding techniques have been adapted to create regional barriers that locally enclose a selected group of EMI sensitive components. However, in such applications, striking a balance between shielding performance and fabrication throughput may be challenging. For instance, a high integrity EMI shielding structure may require wire bonding of high density, which in turn hinders fabrication output.

Accordingly, there remains a need for cost-effective yet reliable selective EMI shielding schemes.

SUMMARY

Embodiments of the instant disclosure provides a semiconductor package, which comprises: a substrate having a first face; at least one first electronic component mounted adjacent to a first region of the first face; at least one second electronic component mounted adjacent to a second region of the first face; and an encapsulant disposed over the first and the second electronic components, wherein the encapsulant covers directly over the first electronic component; wherein the encapsulantr covers the second electronic component through a layer of conductive material.

Embodiments of the instant disclosure also provides a semiconductor package, which comprises: an insulating material that encapsulates at least one electronic component adjacent to a first face of a substrate; a layer of conductive material disposed over the insulating material; and an encapsulant covering the layer of conductive material.

Embodiments of the instant disclosure further provides a semiconductor package, which comprises: a carrier, a first semiconductor component carried by the carrier, an insulating material encapsulating the first semiconductor component, a conductive element covering the insulating material and configured to shield the first semiconductor component, and a packaging body covering the conductive element.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
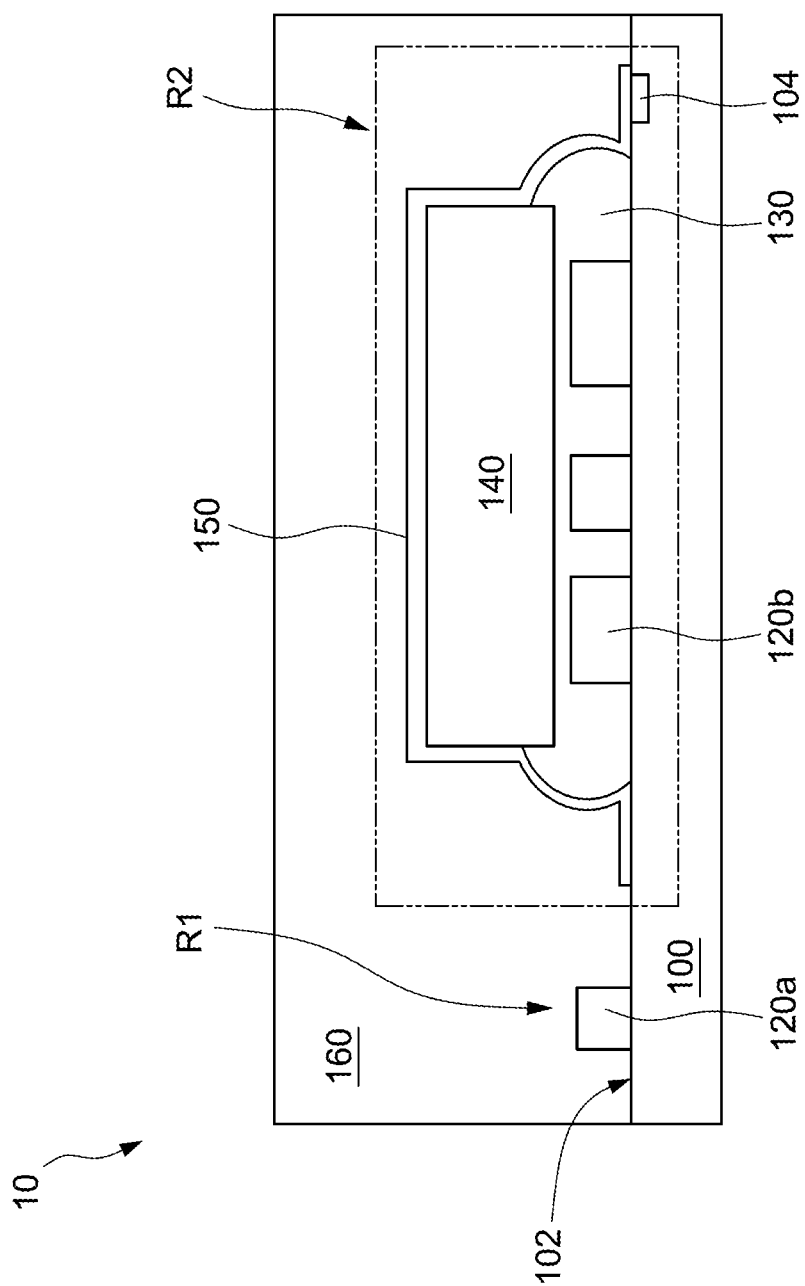
FIG. 1 shows a schematic cross sectional view of a semiconductor package in accordance with some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

As used herein, the term "substrate" means and includes a base material or construction upon which additional materials are formed. For one thing, on a component level, a substrate may refer to a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductor material. On a package level, a substrate may refer to components that provide structural support and enable signal connection for other functional device components, such as a printed circuit board (PCB).

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure.

FIG. 1 shows a schematic cross sectional view of a semiconductor package in accordance with some embodiments of the instant disclosure. For instance, FIG. 1 shows an exemplary semiconductor package 10 that incorporates a selective electromagnetic interference (EMI) shielding scheme, which enables EMI protection to a selected subset of the total electrical components embedded therein.

The exemplary semiconductor package 10 comprises a carrier (e.g., substrate 100) that has a first face 102 and an opposing second face (not explicitly labeled). Over the first face 102 mounted plurality of device components (e.g., electronic components 120a, 120b). Particularly, a first group of component (e.g., component 120a) is in a first region (e.g., a region R1 outside the dotted box), while a second group of components (e.g., 120b) is mounted in a second region (e.g., the region R2 in the enclosed dotted box) over the first face 102.

The substrate (e.g., substrate 100) may comprise, e.g., a paper-based copper foil laminate, a composite copper foil laminate, or a polymer-impregnated glass-fiber-based copper foil laminate. The substrate 100 may include an interconnection structure, such as a redistribution layer (RDL) or an interposer. The substrate 100 may be implemented in a number of ways, and includes electrical interconnect to provide electrical pathways between components mounted on different locations over the first face 102. In some embodiments, the electrical interconnect includes, e.g., a set of electrically conductive layers that are incorporated within a set of dielectric layers. In some embodiments, the electrically conductive layers are connected to one another by internal vias, and can be implemented so as to sandwich a core formed from a suitable resin, such as one based on bismaleimide and triazine or based on epoxy and polyphenylene oxide. In some embodiments, the substrate 100 includes a substantially slabs shaped core that is sandwiched by one set of electrically conductive layers disposed adjacent to an upper surface of the core and another set of electrically conductive layers disposed adjacent to a lower surface of the core. For certain implementations, a thickness of the substrate 100, namely a distance between the first face (e.g., face 102) and the second face (not explicitly labeled), may be in the range of about 0.1 millimeter ("mm") to about 2 mm, such as from about 0.2 mm to about 1.5 mm or from about 0.4 mm to about 0.6 mm. While not illustrated explicitly in FIG. 1, it is contemplated that a solder mask layer may be disposed adjacent to either, or both, the first face and the second face of the substrate 100.

The electronic components (e.g., chips 120a, 120b) may be disposed on the first face 102 of the substrate through suitable arrangements such as flip chip or wire bonding configurations. In some embodiments, the electronic component may be an active component, such as a chip or a semiconductor die. In some embodiments, the device components may include passive devices, e.g., resistors, capacitors, inductors, filters, diplexers, or a combination thereof.

While the illustrated cross sectional view shows only one (1) first-group component (e.g., component 120a), it should be understood that in practical applications, more than one first group component may be visible in a particular cross sectional view. Likewise, while the instant illustration shows three (3) second-group components (e.g., components 120b), more or less electronic components with identical or distinct dimensions or sizes may be arranged in the second region of the semiconductor package 10.

In the illustrated embodiment, the devices of the second-group component 120b are encapsulated by an insulating material (e.g., filler member 130). For instance, the filler member 130 may comprise an insulating filler material disposed over and substantially fills between the plurality of devices from the second-group of components 120b. In some embodiments, each of the plurality of second-group components 120b is maintained with non-zero pitch separation with a neighboring component. For instance, each of the second-group component 120b is arranged with a gap with sufficient width from an adjacent component, so as to allow the insulating material of the filler member 130 to extend into the gap between the device components. In some embodiments, the filler member 130 is formed from insulating gel material, which may be solidified upon a curing process (e.g., ultra-violet/UV radiation). In some embodiments, the filler member 130 is formed from one or more layer of dicing tape, such as die attach film (DAF) or film over wire (FOW) material. In some embodiments, material of the filler member 130 may possess excellent step coverage (e.g., void-filling ability) upon heating (e.g., baking process), and is capable of filling the gaps between the second-group components 120b in a substantially void-less manner.

In some embodiments, the exemplary semiconductor package 10 further comprises a second carrier (e.g., cap member 140) arranged over the filler member 130. For instance, in the illustrated embodiments, the cap member 140 is disposed in direct contact with the filler member 130. In some embodiments, the cap member 140 is kept above the second-group components 120b without establishing contact with the components 120b. The cap member 140 may comprise a substantially rigid plate (e.g., a plate that retains its structural shape/integrity under the ambient conditions of fabrication processes). In some embodiments, the cap member 140 may be a dummy plate utilized as a film carrier for the filler material of the filler member 130 (e.g., for the DAF/FOW). The use of a film carrier may help simplifying the fabrication process and increase film application reliability, as the film-on-carrier units may be prepared in advance to meet the specification of a particular application.

A layer of conductive material 150 is further disposed over the filler member 130, and forms a protective member that provides selective EMI shielding for a subset of the surface-mounted devices (e.g., the second-group components 120b) over the first face 102 of the substrate 100. Moreover, in order to achieve grounding, layer 150 is further configured to be in electrical connection with one or more ground pad (e.g., pad 104) of the substrate 100.

In some embodiments, the shielding members (layer 150) may be formed from one or more layers of conductive thin film that comprises, e.g., a metal, a metal alloy, a matrix with a metal or a metal alloy dispersed therein, or another suitable electrically conductive material. For example, each of the shielding members may be formed from aluminum (Al), copper (Cu), chromium (Cr), tin (Sn), gold (Au), silver (Ag), nickel (Ni), stainless steel, or a combination thereof. Applicable deposition processes may include physical thin film deposition processes such as sputtering, spray coating, and electroplating techniques. In such implementations, a shielding member (e.g., layer 150) may be formed with a thin profile that provides conformal coverage over the selected device components (e.g., the second-group components 120b). In some embodiments, the thickness of the shielding member (e.g., layer 150) may be in the range of about 1 μm to about 500 μm, such as from about 1 μm to about 100 μm, from about 1 μm to about 50 μm, or from about 1 μm to about 10 μm. In other embodiments, a shielding member formed from conductive gel material (and with a greater thickness) may be used over the selected device components on the substrate 100.

In the illustrated embodiment, a packaging body (e.g., an encapsulant, such as a molding member 160) is further provided over the first face 102 of the substrate 100, covering both first group and the second group of the surface mounted devices (e.g., device components 120a, 120b, or interchangeably referring to semiconductor components herein). In some embodiments, the molding member 160 covers directly over the first group of device component(s) 120a. On the other hand, the molding member 160 covers the second group of device components through the layer of conductive material 150. Accordingly, the selective shielding scheme of the instant disclosure may allow integration of both signal transceiving components (e.g., antenna) and EMI sensitive components on a same mounting surface over a single substrate, thereby enabling higher degree of device integration in a reliable and cost-effective manner.

Figure 2:
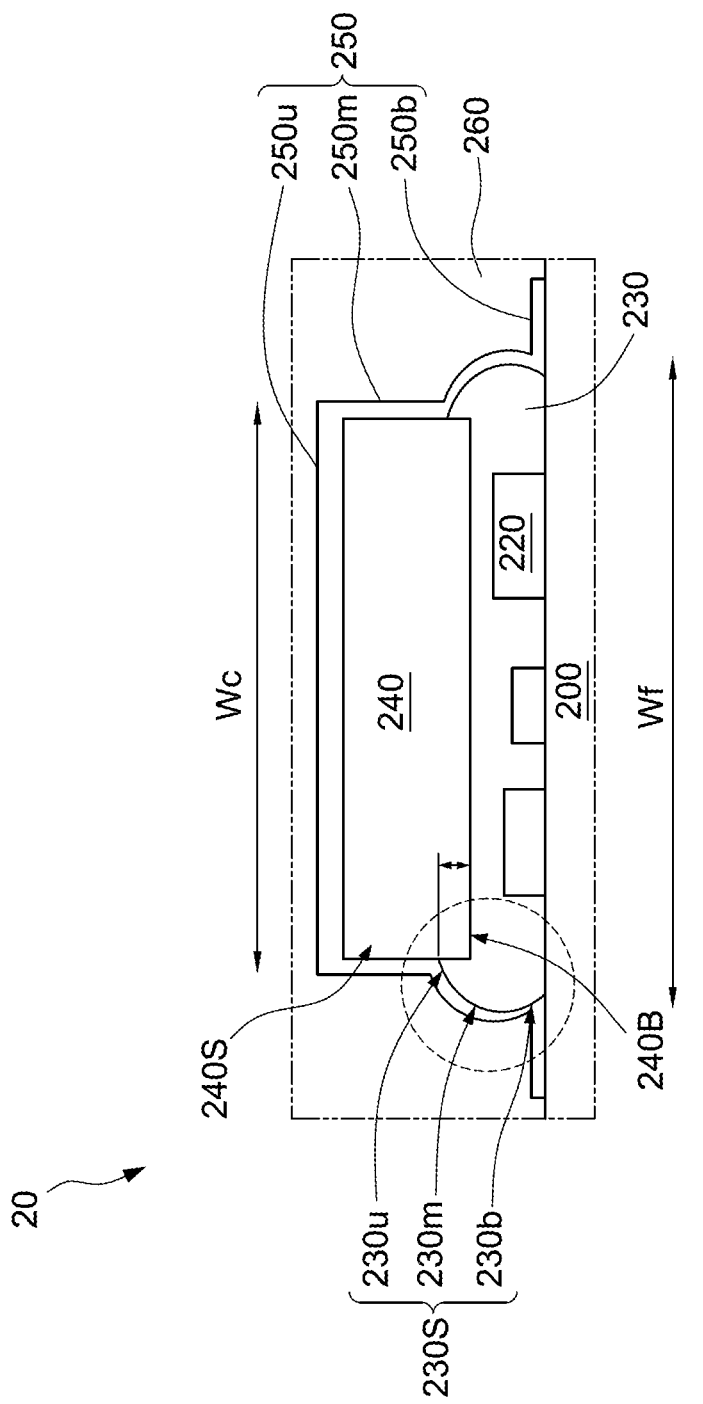
FIG. 2 shows a regional cross sectional view of a semiconductor package in accordance with some embodiments of the instant disclosure.

FIG. 2 shows a regional cross sectional view of a semiconductor package in accordance with some embodiments of the instant disclosure. For instance, FIG. 2 shows a cross sectional view of a selective EMI shielding structure of an exemplary semiconductor package 20. In some embodiments, the regional cross sectional view of FIG. 2 corresponds to the selectively shielded region (e.g., region R2) shown in FIG. 1.

The regional view of the exemplary semiconductor package 20 shows a substrate 200 that has a first face (not explicitly labeled), on which a plurality of device components (hereinafter interchangeably referring to electronic components or chips 220 or semiconductor components) are mounted. Particularly, the group of device components (e.g., chips 220, which correspond to the second group of electronic components 120b shown in FIG. 1) may comprise EMI sensitive devices that seek selective shielding protection. The illustrated embodiment shows three (3) selectively shielded device components (e.g., chip 220) having distinct sizes and dimensions (e.g., different heights and widths) arranged on the semiconductor package 10. Nevertheless, it is noted that the exact number and dimension/profile of the device components under selective EMI protection need not be limited to that shown in the instant illustration.

In the illustrated embodiment, device components (e.g., chip 220) are encapsulated by a filler member 230. The filler member 230 may comprise an insulating filler material disposed over and substantially fills between the plurality of device components. In some embodiments, the encapsulated components (e.g., chip 220) are maintained with non-zero pitch separation. The pitch separation between the chips allow the insulating material of the filler member 230 to flow in and fill the gap in-between. As there is usually a wide variety of insulating gel material available in a semiconductor packaging plant, the ease of material accessibility facilitates fabrication cost-effectiveness. The filler member 230 may be formed from insulating gel material. Alternatively, the filler member 230 may be formed from one or more layer of dicing tape (another readily available material in the field of semiconductor packaging), such as die attach film (DAF) or film over wire (FOW) material. Depending on specific formulation, the material of the dicing tape may possess excellent void-filling ability upon heating (e.g., baking process). The filler member 230 may thus extend into the gap between the device components (e.g., chip 220), thereby providing structural protection to the delicate chips, as well as serving as a foundation/buffer interface for the subsequently formed EMI shielding member (e.g., layer 250). It is noted that, however, in some embodiments, the filler member 230 may not fully fill the gap between the device components 220. Nevertheless, in some embodiments, having void(s) between the device components may be acceptable given the overall structural integrity meets the application specification.

The exemplary semiconductor package 20 further comprises a cap member 240 disposed over the filler member 230. In the illustrated embodiments, the cap member 240 is disposed physically on the filler member 230. In the illustrated embodiment, the cap member 240 is kept above the group of device components (e.g., chip 220) without establishing contact therewith. In some embodiments, a dummy die made of silicon material or a plastic plate made from FR4 composite material may be utilized to serve as the cap member 240.

In the illustrated embodiment, a layer of conductive material 250 is disposed over the filler member 230 and the capping member 240. The layer of conductive material 250 forms a shielding member that enables selective EMI protection for a subset of the surface-mounted devices over the first face of the substrate 200 (e.g., chip 220). In addition, layer 250 is configured to establish electrical connection with one or more ground pad (not explicitly shown) of the substrate 200 to achieve grounding.

In the illustrated embodiment, a molding member 260 is further provided over the first face of the substrate 200 to provide protection for the internal components of the package from ambient hazards. In some embodiments, the molding member 260 covers all the surface mounted device components, including the ones under selective EMI protection (e.g., the group of chips under the cap member 240). Particularly, the molding member 260 covers the selected group of device components (e.g., chip 220) through the embedded shielding member (e.g., layer 250).

In some embodiments, the filler member 230 defines a lateral surface 230S that has a generally convex curving profile. In the illustrated embodiment, the lateral surface 230S forms a convex curved profile that extends from a lateral surface 240S of the cap member 240 to the first face of the substrate 200 in a lateral cross section. Moreover, the lateral surface 230S of the filler member 230 is covered by the shielding member (e.g., layer 250). In the illustrated embodiment, an upper border 230u (e.g., the upper corner pointed out by the arrow) of the filler member 230 is situated at a higher elevation (in accordance with the orientation shown in FIG. 2) than a bottom surface 240B of the cap member 240. In some embodiments, such a profile is generated by the downward pressure on the filler film (e.g., dicing tape, such as DAF/FOW) carrier (e.g., cap member 240) during a baking operation of the package fabrication process (e.g., during a baking process for the die-attach operation of the cap member 240). The baking process softens the material of the filler film and enhances its void-filling property, which in turn causes the bottom surface 240B of the cap member 240 to sink into the filler member 230. In some embodiments, the convex curving profile of the filler member 230 is generated by such downward pressure during the baking operation. In the illustrated embodiment, a lateral width Wf defined between the lateral surfaces 230S of the filler member 230 is wider than a lateral width Wc of the cap member 240.

In some embodiments, the layer of conductive material 250 (which forms an embedded selective shielding member) comprises a substantially conformal metallic film that forms a continuous coverage over a top surface (not explicitly labeled) and the lateral surface 230S of the cap member 240. Moreover, layer 250 further extend over a portion of the first face of the substrate 200. Accordingly, layer 250 generally forms conformal shielding structure that comprises three sections (in a cross-sectional view): (a) an upper coverage section 250u over a top surface of the cap member 240; (b) a middle coverage section 250m over the lateral surfaces 230S and 240S of the filler member 230 and the cap member 240, respectively; and (c) a bottom coverage section 250b that covers a portion of the first face of the substrate 200.

In some embodiments, a thickness of the upper coverage section 250u (over the top surface of the cap member 240) is substantially greater than a thickness of the bottom coverage section 250b (over the first face of the substrate 200). In some embodiments, a thickness of the bottom coverage section 250b is greater than a thickness of the middle coverage section (over the lateral surfaces 230S, 240S).

Figure 3:
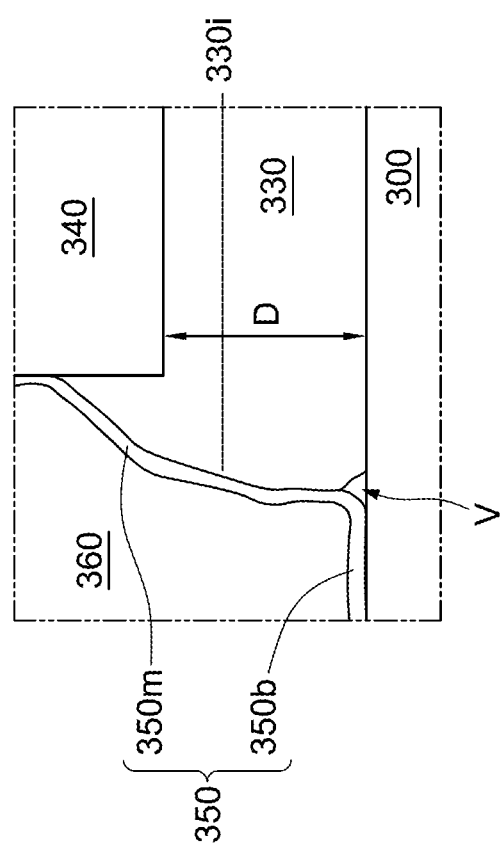
FIG. 3 shows a regional enlargement view of a semiconductor package in accordance with some embodiments of the instant disclosure.

FIG. 3 shows a regional enlargement view of a semiconductor package in accordance with some embodiments of the instant disclosure. For instance, the schematic regional enlargement view of FIG. 3 may correspond to the structural features enclosed in the dotted circle at the lower left corner of FIG. 2. It is noted that, some of the illustrated components comparable to those depicted in previous embodiments may not be discussed individually for the sake of disclosure brevity.

Particularly, FIG. 3 shows a material interface region between several structural components of an exemplary semiconductor package, which comprises a substrate 300. For instance, FIG. 3 shows a material interface between a filler member 330 (which may encapsulate a group of device components such as chip 120b shown in FIG. 1), a cap member 340 (which sinks into the filler member 330), a molding member 360 (which forms an exposed encapsulation structure over the surface mounted components on the substrate 300), and a conductive layer 350 (which is embedded in the molding member 360, and arranged between the molding member 360 and the filler member 330). The schematic illustration of FIG. 3 further shows a lateral coverage section 350m of the conductive layer 350 (which covers the lateral surfaces of the filler member 330) and a planar coverage section 350b of the conductive layer 350 (which forms an embedded EMI shielding structure for a selected subgroup of the surface mounted device components, e.g., chips 120b as shown in FIG. 1).

In some embodiments, a standoff distance D between the cap member 340 and the substrate 300 (which translates into a general thickness of the filler member 330) is in a range of about 70-90 microns (μm). In some embodiments, an upper portion of the lateral coverage section 350m of layer 350 (e.g., the portion that covers the lateral surface of the cap member 340) is in a range of about 3.0-4.0 μm. In some embodiments, a lower portion of the lateral coverage section 350m of layer 350 (e.g., the portion in contact with the filler member 330) is in a range of about 3.5-6.5 μm. In some embodiments, the planar coverage section 350b of layer 350 (e.g., the portion that extends over the first face of substrate 300) is in a range of about 6.0-7.5 μm. It should be noted that, however, the actual regional thickness of the shielding structure (e.g., conductive layer 350) may be varied based on particular application specification.

In the illustrated embodiment, a void V is formed under the layer of conductive material 350 at an interface between the filler member 330 and the first face of the substrate 300. In some embodiments, the filler member 330 may comprise an mid-layer interface (e.g., observable boundary 330i) that traverses across a lateral width (e.g., width Wf as shown in FIG. 2) thereof. The mid-layer interface 330i may be a result from the use of multi-layered dicing tape as the filler member 330.

By way of example, whether or not a cap member (e.g., member 340) is adapted in a package in accordance with the instant disclosure, a filler member (e.g., member 330) is generally provided with a thickness greater than the height of the device components it covers. In some embodiments where a cap member is utilized, the filler member may have a thickness substantially equal to the height of the tallest device component (in which case, the cap member may be in contact with the device component). In the embodiments where dicing tapes are utilized to form filler members (e.g., member 330), sufficient thickness of the tape material would be required to form a filler member of adequate height, so as to cover the selected group of device components in a substantially void-less manner. However, dicing tapes of ideal thickness for different packaging applications may not always be available. For instance, the specification of a widely available off-the-shelf DAF comprises a thickness of about 200 μm.

To increase material accessibility and reduce manufacturing cost, in the embodiments where taller components are used (e.g., chips with heights greater than a single layer of a 200 μm tape), a stack of multiple DAF layers may be utilized. For example, a stack of two DAF layers may be prepared on a carrier (e.g., cap member 340) in advance. During the package fabrication process, the carrier may be turned to have the stack of DAFs facing the device components designated for selective protection (e.g., chips 120b). Upon a subsequent baking (and curing) process, the material from the stack of DAFs may join together to encapsulate (and fill the gaps between) the selected device components, whereby an observable boundary 330i may be generated between the layers of DAFs.

Figure 4:
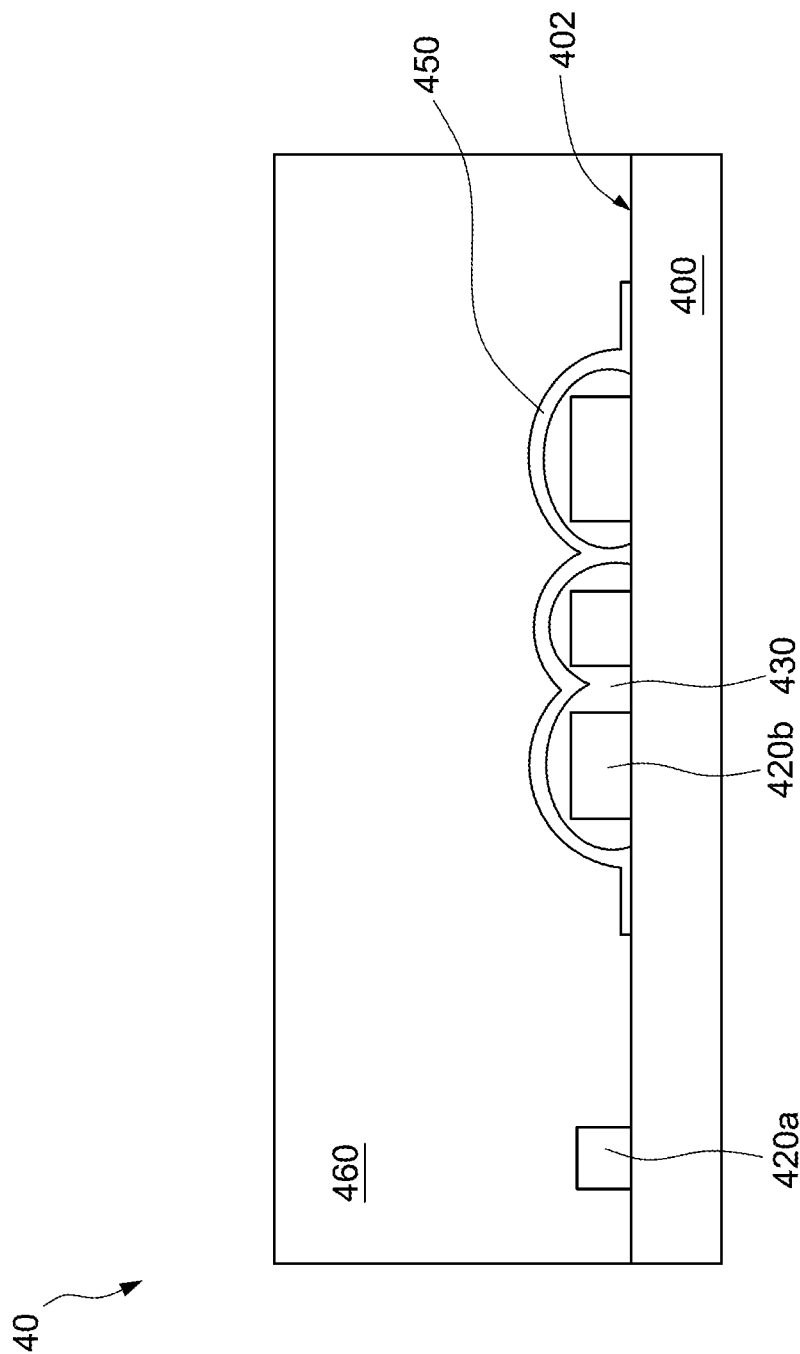
FIG. 4 shows a schematic cross sectional view of a semiconductor package in accordance with some embodiments of the instant disclosure.

FIG. 4 shows a schematic cross sectional view of a semiconductor package in accordance with some embodiments of the instant disclosure. For instance, an exemplary semiconductor package 40 in accordance with some embodiments of the instant disclosure is illustrated. It is noted that, some of the illustrated components comparable to those depicted in previous embodiments may not be discussed individually for the sake of disclosure brevity.

The exemplary semiconductor package 40 comprises a substrate 400 that hosts a plurality of device components (e.g., including first-group chip(s) 420a and second-group chips 420b) on a first face 402 thereof. The package 40 incorporates an embedded shielding structure capable of providing selective EMI shielding for a selected subset of the surface mounted device components on the substrate 400. For instance, the shielding structure comprises a filler member 430 that encapsulates the second-group chips 420b over the first face of the substrate 400.

A shielding member (e.g., conductive layer 450) is disposed of the filler member 430. A molding member 460 is disposed over and covers the shielding member 450. As illustrated in the instant embodiment, the shielding member (e.g., conductive layer 450) provides a selective planar coverage over the substrate 400 that is less than a total planar area of the first face 402.

In some embodiments, the filler member 430 comprises insulating material made from gel material. In the illustrated embodiment, the shielding member (conductive layer 450) comprises a substantially conformal metallic film that forms a continuous coverage over a top and lateral surfaces of the filler member 430. Layer 450 further extends over a portion of the first face 402. In some embodiments, the shielding member (e.g., layer 450) may be formed from one or more layers of conductive thin film that comprises, e.g., a metal, a metal alloy, a matrix with a metal or a metal alloy dispersed therein, or another suitable electrically conductive material. Applicable deposition processes for forming the conductive layer 450 may include physical thin film deposition processes such as sputtering, spray coating, and electroplating techniques. In such implementations, an EMI shielding layer may be formed to provide conformal coverage over the selected electronic components (e.g., second-group chips 420b) on the substrate 400. In some embodiments, a planar (e.g., horizontal) portion of the conductive layer 450 may possess a greater thickness than a lateral (e.g., vertical) coverage thereof. For instance, the bottom coverage section of the conductive layer 450 (over the first face of the substrate 400) may possess a greater average thickness than the middle coverage section (e.g., over the curved lateral surfaces of the filler member 430). In addition, in some embodiments, the gel material of the filler member 430 may not necessarily provide a continuous coverage over all the second-group chips 420b. For instance, in the illustrated cross section of FIG. 4, the filler member 430 is actually composed of two sub-portions; with the first sub-portion (toward the left of the page) being shown to encapsulate a pair of chips 420b, while the second sub-portion (toward the right) encapsulate only a single chip. As such, the conformal coverage of the conductive layer 450 may extend between sub-portions of the filler member 430 and reach the first face 402 of the substrate 400.

Figure 5:
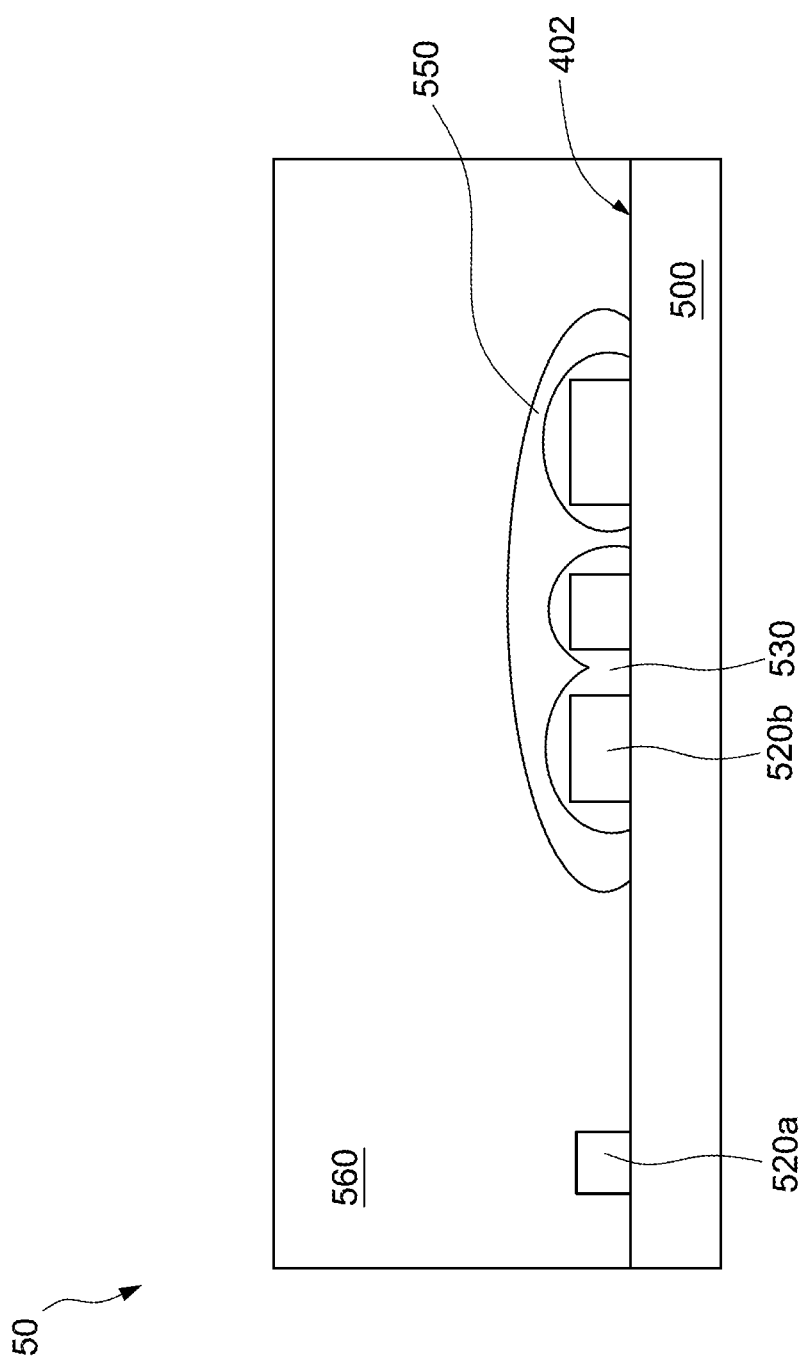
FIG. 5 shows a schematic cross sectional view of a semiconductor package in accordance with some embodiments of the instant disclosure.

FIG. 5 shows a schematic cross sectional view of a semiconductor package in accordance with some embodiments of the instant disclosure. For instance, an exemplary semiconductor package 50 in accordance with some embodiments of the instant disclosure is illustrated. It is noted that, some of the illustrated components comparable to those depicted in previous embodiments may not be discussed individually for the sake of disclosure brevity.

The exemplary semiconductor package 50 comprises a substrate 500 that hosts a plurality of device components (e.g., including first-group chip(s) 520a and second-group chips 520b). The package 50 incorporates an embedded shielding structure capable of providing selective EMI shielding for a selected subset of the surface mounted device components on the substrate. For instance, the shielding structure comprises a filler member 530 that evades a first region over the substrate (e.g., the region where chip 520a is located) while encapsulates devices that are distributed in a second region (e.g., the region where chips 520b congregate).

A shielding member (e.g., conductive layer 550) is disposed of the filler member 530. A molding member 560 is disposed over and covers the shielding member 550. As illustrated in the instant embodiment, the shielding member 550 provides a selective planar coverage over the substrate 500 that is less than the total planar area of the first face 502.

In some embodiments, the filler member 530 comprises insulating material made from gel material. As discussed previously, the gel material of the filler member 530 may not necessarily provide a continuous coverage over all the second-group chips 420b. In the instant illustration, the exemplary package 50 further utilizes a shielding member 550 that comprises a conductive material made from conductive gel. The conductive material of the shielding member 550 further extends onto the first face 502 of the substrate 500. The employment of the illustrated double gel stack arrangement may further reduce fabrication complexity and reduce manufacturing cost.

FIG. 6A-6E shows schematic illustration of a semiconductor package during various stages of fabrication in accordance with some embodiments of the instant disclosure. Please note that, the element numerals of some prior-labeled components may be omitted in subsequent drawings for the clarity of illustration.

Figure 6A:
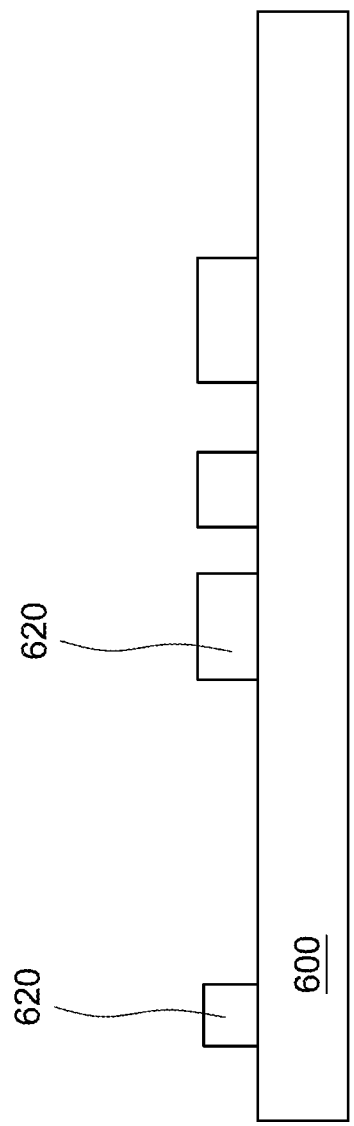
FIG. 6A-6E shows schematic illustration of a semiconductor package during various stages of fabrication in accordance with some embodiments of the instant disclosure.

Referring to FIG. 6A, an exemplary fabrication method may start from receiving a substrate 600 having a plurality of device components (e.g., chips 620) mounted on a first face thereof. The device components (e.g., chips 620) may concurrently include signal transceiving components (e.g., antenna) and sensitive components (e.g., fast switching logic components) that are more prone to electromagnetic interference. The two types of components may be grouped in different regions over the first face of the substrate 600.

Figure 6B:
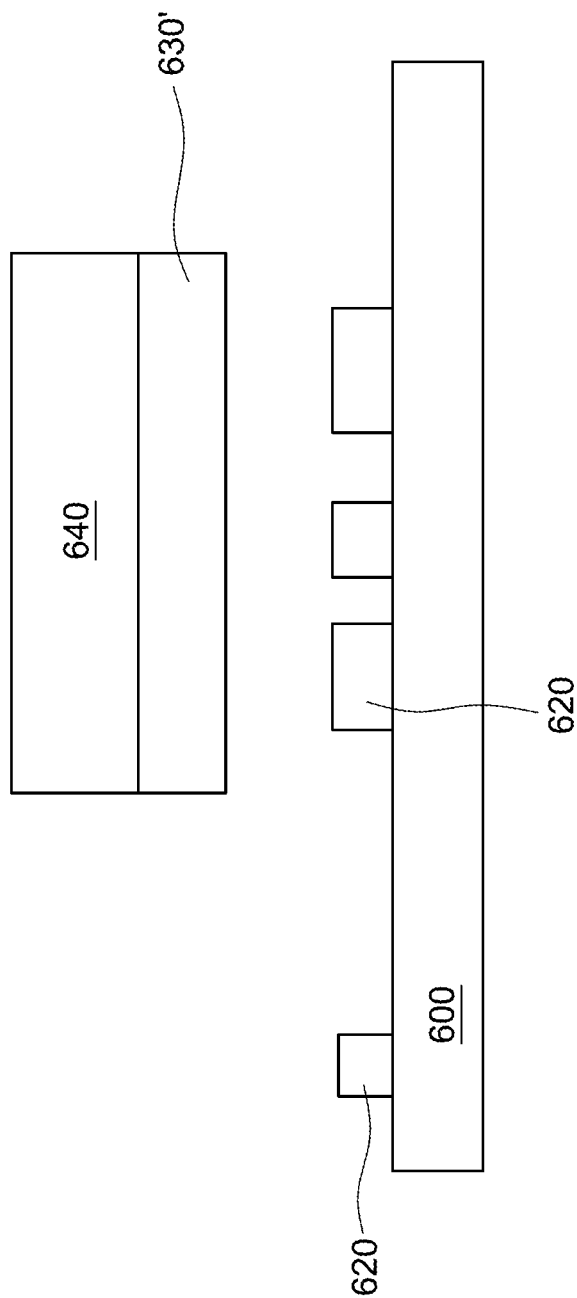

Referring to FIG. 6B, a first group of the plurality of device components 620 (e.g., the group of EMI sensitive devices selected to be shielded) is encapsulated with an insulating material. In the illustrated embodiment, a carrier plate (e.g., cap member 640) is prepared with one or more layer(s) of dicing tape 630' (that comprises insulating filler material) stacked thereon. In some embodiments, the carrier plate (e.g., cap member 640) is made of substantially rigid material such as silicon or composite plastic material such as FR4.

The carrier and tape combination (630'/640) is disposed over the substrate 600 with the tape portion 630' aligning to the selected device components that seek EMI shielding (which are grouped in a first region over the substrate 600). A baking process may then be performed to cause the encapsulation of filler material around the first group of device components.

In some embodiments, the encapsulation of a first group of electronic components comprises selectively disposing insulting gel (e.g., member 430/530 shown in previous embodiments) over a subset of the plurality of electronic components on the first face of the substrate. In such embodiments, the employment of a carrier (e.g., cap member 640) may be omitted.

Figure 6C:
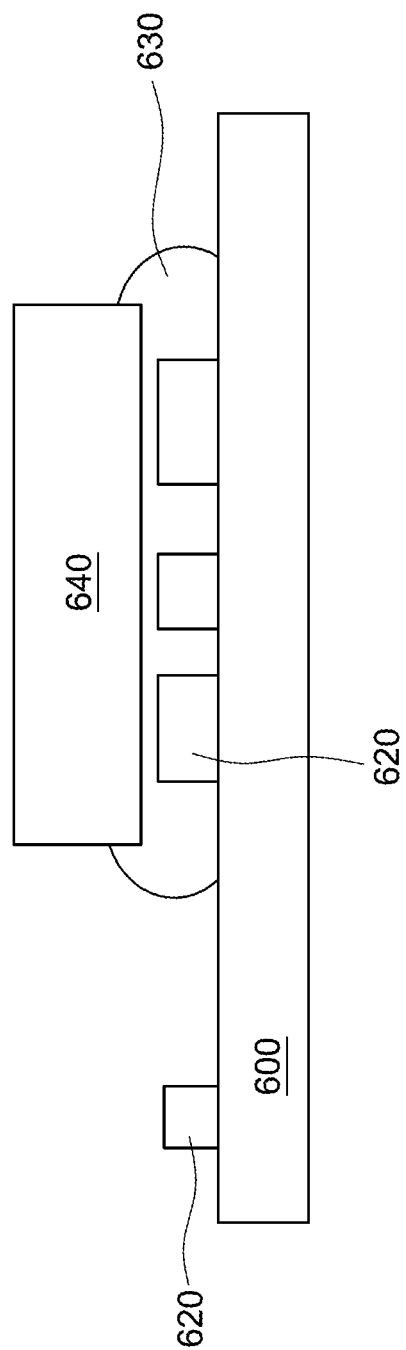

Referring to FIG. 6C, upon curing, a filler member 630 is formed under the cap member 640. In some embodiments, a downward pressure during the baking process causes the cap member 640) to sink into the filler member 630. In some embodiments, the downward pressure to the cap member 640 is constrained so as to leave a clearance between the cap member 640 and a tallest device component there-under without establishing physical contact. In addition, the downward pressure may squeeze the softened filler material and causes it to extend laterally over either sides of the of the cap member 640, causing the overall width of the filler member 630 to be wider than that of the cap member 640. In some embodiments, the portion of the filler member 630 that protrudes beyond the side surfaces of the cap member 640 may have a substantially curved convex profile.

Figure 6D:
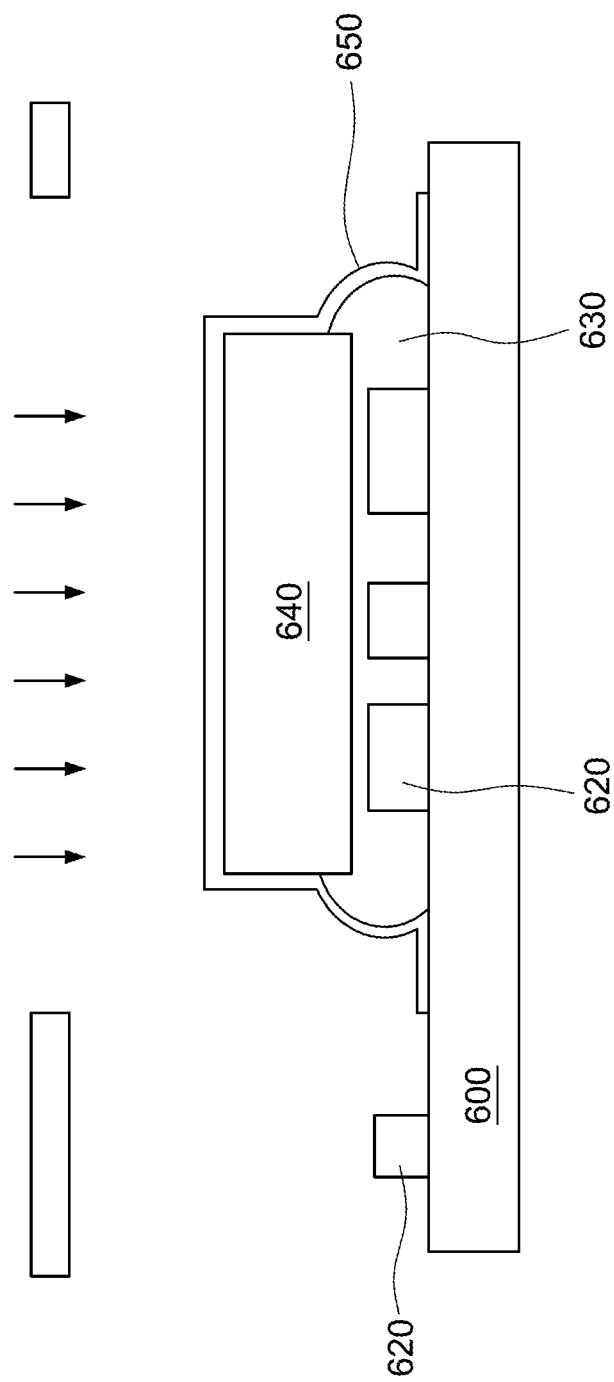

Referring to FIG. 6D, a layer of conductive material (e.g., layer 650) is disposed over the first region (e.g., the region in which the selected group of sensitive chips 620 are distributed) on the first face of the substrate 600. The layer of conductive material 650 forms a selective shielding structure over the filler member 630 and the cap member 640. In some embodiments, the shielding structure comprises a metallic film. Suitable deposition methods such as sputtering, spray coating, and electroplating techniques may be used to form the selective shielding structure. In some embodiments, the deposition process to form layer 650 is performed through a mask patterned to allow corresponding access to the first region on the substrate 600.

In some embodiments, the forming of the selective shielding structure may comprise selectively disposing a conductive gel (e.g., member 550 shown in previous embodiments) over the encapsulating insulating material (e.g., member 630).

Figure 6E:
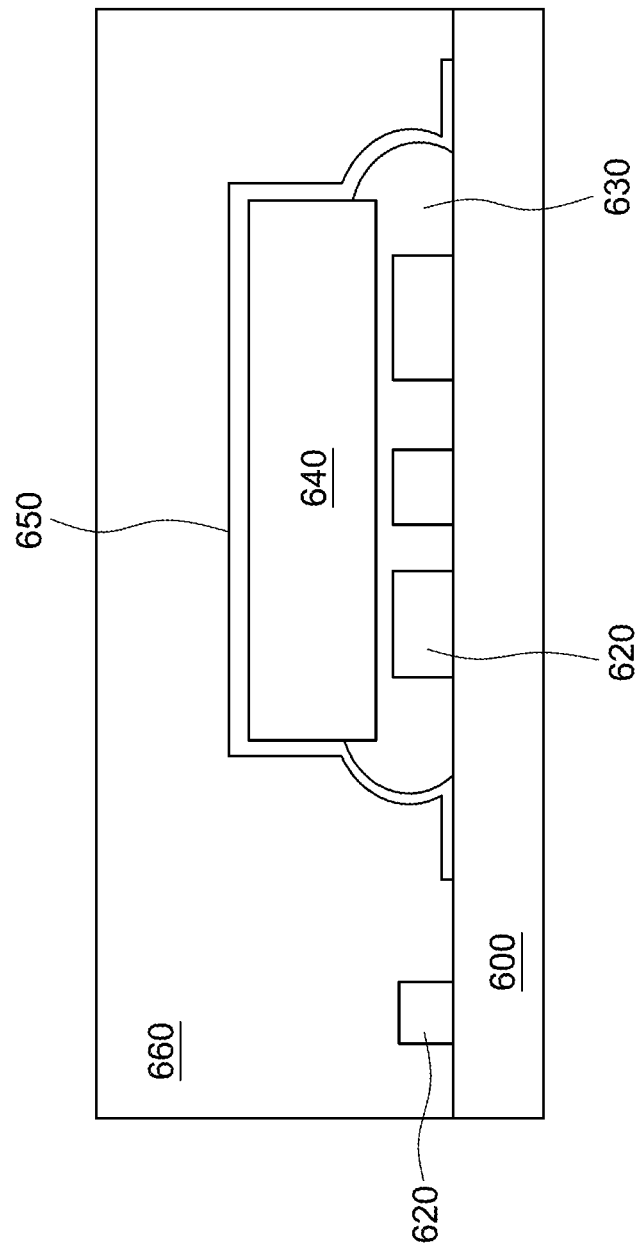

Referring to FIG. 6E, molding material is disposed over the layer of conductive material 650 and covers the first face of the substrate 600 to form a molding member 660. As shown in the instant illustration, the molding member 660 is disposed over both the shielded group (e.g., EMI sensitive group) and the unshielded group (e.g., signal transceiving group) of components over a same substrate surface. Accordingly, a semiconductor package incorporating an embedded selective shielding scheme is provided.

Accordingly, one aspect of the instant disclosure provides a semiconductor package, which comprises: a substrate having a first face; at least one first electronic component mounted adjacent to a first region of the first face; at least one second electronic component mounted adjacent to a second region of the first face; and an encapsulant disposed over the first and the second electronic components, wherein the encapsulant covers directly over the first electronic component; wherein the encapsulantr covers the second electronic component through a layer of conductive material.

Accordingly, another aspect of the instant disclosure provides a semiconductor package, which comprises: an insulating material that encapsulates at least one electronic component adjacent to a first face of a substrate; a layer of conductive material disposed over the insulating material; and an encapsulant covering the layer of conductive material.

Accordingly, one aspect of the instant disclosure provides a semiconductor package, which comprises: a carrier, a first semiconductor component carried by the carrier, an insulating material encapsulating the first semiconductor component, a conductive element covering the insulating material and configured to shield the first semiconductor component, and a packaging body covering the conductive element.

Those skilled in the art will readily observe that numerous modifications and alterations of the device and method may be made while retaining the teachings of the instant disclosure. Accordingly, the above disclosure should be construed as limited only by the metes and bounds of the appended claims.

What is claimed is:

1. A semiconductor package, comprising:
   a substrate having a first face;
   at least one first electronic component mounted adjacent to a first region of the first face;
   a plurality of second electronic components mounted adjacent to a second region of the first face;
   an encapsulant disposed over the first and the second electronic components, wherein the encapsulant covers directly over the at least one first electronic component, and wherein the encapsulant covers the plurality of second electronic components through a layer of conductive material;

an insulating material disposed over and between the plurality of second electronic components; and a cap member over the plurality of second electronic components and in contact with the insulating material, wherein the insulating material defines a lateral surface covered by the layer of conductive material, wherein an upper border of the insulating material is higher than a bottom surface of the cap member.

2. The semiconductor package of claim 1, wherein the lateral surface defines a convex curved profile extending from a lateral surface of the cap member to the first face of the substrate in a lateral cross-section.

3. The semiconductor package of claim 1, wherein the cap member is kept at a standoff distance over the plurality of second electronic components without contacting the plurality of second electronic components.

4. A semiconductor package, comprising:

a substrate having a first face;

at least one first electronic component mounted adjacent to a first region of the first face;

a plurality of second electronic components mounted adjacent to a second region of the first face;

an encapsulant disposed over the first and the second electronic components, wherein the encapsulant covers directly over the at least one first electronic component, and wherein the encapsulant covers the plurality of second electronic components through a layer of conductive material;

an insulating material disposed over and between the plurality of second electronic components; and a cap member over the plurality of second electronic components and in contact with the insulating material, wherein the layer of conductive material comprises a metallic film that provides substantially conformally coverage over a top surface of the cap member, a lateral surface of the cap member, and a portion of the first face of the substrate.

5. The semiconductor package of 7, wherein a thickness of the metallic film over the top surface of the cap member is greater than a thickness of the metallic film over the substrate, and wherein the thickness of the metallic film over the substrate is greater than a thickness of the metallic film over the lateral surface of the cap member.

* * * * *